United States Patent
Wong et al.

(10) Patent No.: US 9,417,131 B2
(45) Date of Patent: Aug. 16, 2016

(54) COLORIMETER CALIBRATION SYSTEM AND METHODS

(71) Applicant: Mattel, Inc., El Segundo, CA (US)

(72) Inventors: Koon Cheong Wong, Tuen Mun (HK); Yiu Keung Man, Fanling (HK)

(73) Assignee: Mattel, Inc., El Segundo, CA (US)

( * ) Notice: Subject to any disclaimer, the term of this patent is extended or adjusted under 35 U.S.C. 154(b) by 190 days.

(21) Appl. No.: 14/326,317

(22) Filed: Jul. 8, 2014

(65) Prior Publication Data

US 2015/0009500 A1   Jan. 8, 2015

Related U.S. Application Data

(60) Provisional application No. 61/843,807, filed on Jul. 8, 2013.

(51) Int. Cl.

| | |
|---|---|
| *G01J 3/46* | (2006.01) |
| *G01J 3/50* | (2006.01) |
| *G01R 35/00* | (2006.01) |
| *G01J 3/52* | (2006.01) |

(52) U.S. Cl.
CPC ............... *G01J 3/501* (2013.01); *G01J 3/524* (2013.01); *G01R 35/005* (2013.01)

(58) Field of Classification Search
USPC .......................................... 356/402
See application file for complete search history.

(56) References Cited

U.S. PATENT DOCUMENTS

| 2,832,257 | A  | 4/1958  | Hunter |
| 3,020,793 | A  | 2/1962  | Neubrech |
| 3,060,790 | A  | 10/1962 | Ward |
| 3,675,925 | A  | 7/1972  | Ryan et al. |
| 3,676,686 | A  | 7/1972  | Allington |
| 3,804,531 | A  | 4/1974  | Kosaka et al. |
| 3,910,701 | A  | 10/1975 | Henderson et al. |
| 4,917,500 | A  | 4/1990  | Lugos |
| 5,075,770 | A  | 12/1991 | Smyth |
| 5,168,320 | A  | 12/1992 | Lutz et al. |
| 5,303,037 | A  | 4/1994  | Taranowski |
| 5,691,817 | A  | 11/1997 | Cargill et al. |
| 5,694,227 | A  | 12/1997 | Starkweather |
| 5,838,465 | A  | 11/1998 | Satou et al. |
| 5,982,501 | A  | 11/1999 | Benz et al. |
| 6,505,002 | B2 | 1/2003  | Fields |
| 7,023,584 | B2 | 4/2006  | Cowan et al. |

(Continued)

FOREIGN PATENT DOCUMENTS

| EP | 0 375 317 | 6/1990 |
| WO | WO-2010/038898 | 4/2010 |

*Primary Examiner* — Kara E Geisel
*Assistant Examiner* — Hina F Ayub
(74) *Attorney, Agent, or Firm* — Foley & Lardner LLP

(57) ABSTRACT

A toy playset with a colorimeter and method of calibration is provided. The colorimeter may include the combination of a microcontroller with multiple switchable output ports, a light source connected to three of the output ports, and a photo transistor for sensing reflected light. The colorimeter may include four different resistors, each of the resistors connected to a corresponding additional one of the output ports, with the four different resistors connected in parallel to the photo transistor. The colorimeter may be programmed to cycle through the resistors and select a calibration based on a low predefined voltage target for reflection from a black surface and a higher predefined voltage target for reflection from a white surface. The light source is a RGB light source having a tri-band wavelength light.

20 Claims, 10 Drawing Sheets

(56) References Cited

U.S. PATENT DOCUMENTS

| | | |
|---|---|---|
| 7,097,532 B1 | 8/2006 | Rolicki et al. |
| 7,385,701 B2 | 6/2008 | Watanabe et al. |
| 7,428,994 B1 | 9/2008 | Jeffway et al. |
| 7,466,416 B2 | 12/2008 | Baker et al. |
| 7,502,112 B2 | 3/2009 | Kahn et al. |
| 7,557,924 B2 | 7/2009 | Nisper et al. |
| 8,319,969 B2 | 11/2012 | Clark et al. |
| 2002/0118967 A1 | 8/2002 | Funston |
| 2002/0145769 A1 | 10/2002 | Pollard |
| 2004/0136004 A1 | 7/2004 | Collins |
| 2006/0139644 A1* | 6/2006 | Kahn ............. G01J 3/02 356/406 |
| 2007/0188759 A1 | 8/2007 | Mehendale et al. |
| 2009/0098792 A1 | 4/2009 | Cheng et al. |
| 2012/0153839 A1 | 6/2012 | Farley et al. |

* cited by examiner

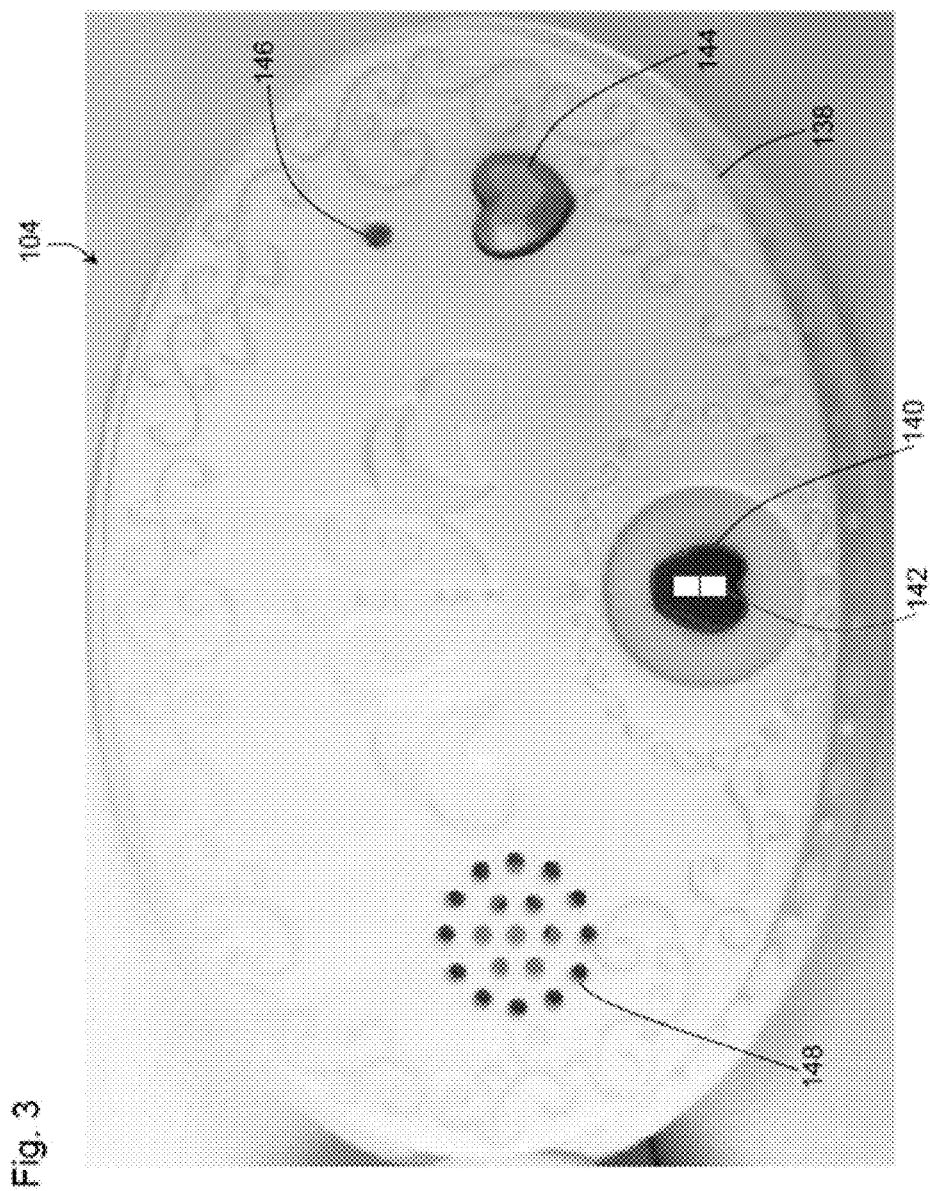

US 9,417,131 B2

COLORIMETER CALIBRATION SYSTEM AND METHODS

CROSS-REFERENCE TO RELATED APPLICATIONS AND CLAIM OF PRIORITY

This application claims the benefit of U.S. Provisional Patent Application No. 61/843,807, filed on Jul. 8, 2013, which is incorporated herein by reference in its entirety.

BACKGROUND

This disclosure relates to an electronic game device that is configured to recognize colors. More particularly, the disclosure relates to systems and methods for calibrating a colorimeter to be used in a variety of applications. In general, a colorimeter is a system that determines a color of a scanned surface by absorbing and/or sensing light reflected off of the scanned surface.

There are many types of electronic game devices. Typically, these electronic game devices may receive user input in the forms of a button or placement of a toy over a sensor. The disclosure relates to electronic game devices with the ability to provide creative, dynamic and enjoyable game play for a user. The following disclosure relates to toys that are interactive and exhibit intelligence that fascinates a user.

SUMMARY OF THE DISCLOSURE

Embodiments relate to methods of calibrating and using a colorimeter. The colorimeter may include a microcontroller with multiple switchable output ports, a RGB (red, green, and blue) LED (light emitting diode) light source connected to three of the output ports, a photo transistor for sensing reflected light, at least two different resistors, each of the resistors connected to a corresponding additional one of the output ports, with the two different resistors connected in parallel to the photo transistor. The microcontroller may be programmed to cycle through the resistors and select a calibration based on a low predefined voltage target for reflection from a black surface and a higher predefined voltage target for reflection from a white surface. The calibration process of the colorimeter may identify a resistor combination for use with the phototransistor that provides the colorimeter with the best sensitivity for each of the LED colors.

Some embodiments include a combination of a colorimeter having a microprocessor with multiple switchable output ports, a light source (e.g., RGB light) connected to three of the output ports, a photo transistor for sensing reflected light, at least two different resistors, each of the resistors connected to a corresponding additional one of the output ports, the at least two different resistors configured to connect the photo transistor to the microprocessor. The colorimeter may include a microprocessor that is configured to cycle through the at least two resistors and select a calibration based on a first predefined voltage target for reflection from a first reference surface and a second predefined voltage target for reflection from a second reference surface. In various embodiments, selecting a calibration may include the microprocessor configured to select a resistor or a set of resistors (resistance value) based on the first predefined voltage target for reflection from the first reference surface and the second predefined voltage target for reflection from the first reference surface. In various embodiments, the first predefined voltage target is different than the second predefined voltage target. In some embodiment, the first predefined voltage target is lower than the second predefined voltage target. The colorimeter may be configured to select a calibration using a process that comprises the microprocessor configured to store a resistor or resistor combination that allows the photo transistor to generate a lowest voltage for reflection from the black surface and that further comprises the microprocessor configured to store a resistor or resistor combination that allows the photo transistor to generate a highest voltage for reflection from the second reference surface. In various embodiments, the first reference surface is colored black and the second reference surface is colored white.

The colorimeter mentioned has a microprocessor that is configured to determine which of the at least two different resistors generate the largest difference between a reflectance value from a reflection of the first reference surface and a reflectance value from a reflection of the second reference surface by cycling through the at least two resistors for the light source. In other embodiments, the colorimeter with the light source is a tri-band wavelength light source that may include one or more lights that are configured to generate colored lights comprising at least one of a red, green or blue light when activated. In other embodiments, the colorimeter has a microprocessor that is configured to determine which of the at least two different resistors or a combination of the two resistors generate the difference gradient between a reflectance value from a reflection of the first reference surface and a reflectance value from a reflection of the second reference surface by cycling through the at least two resistors for the red light. In various embodiments, the microprocessor is further configured to determine which of the at least two different resistors or a combination of the two resistors generate the largest difference between a reflectance value from a reflection of the first reference surface and a reflectance value from a reflection of the second reference surface by cycling through the at least two resistors for the green light and the microprocessor is further configured to determine which of the at least two different resistors or a combination of resistors generate the largest difference between a reflectance value from a reflection of the first reference surface and a reflectance value from a reflection of the second reference surface by cycling through the at least two resistors for the blue light.

In yet another embodiment, the microcontroller may be configured to use the determined resistance load for the red light and use the determined one of the at least two resistors for the green light. In some embodiments, the microcontroller is configured to use the determined resistance load for the blue light. In some embodiments, the resistance load is one resistor or a combination of resistors. In various embodiments the two different resistors in the colorimeter are connected in parallel or in series to the phototransistor. In some embodiments, the light source has at least one of a red light source, a green light source and a blue light source that are powered sequentially to generate a light that shines and reflects from a first reference surface or a second reference surface, and the microcontroller is configured to determine which of the at least two resistors or the combination of the at least two resistors generates the largest difference between a reflectance value from a reflection of the first reference surface and a reflectance value from a reflection of the second reference surface. Accordingly, the set of resistors that create the largest variance in output between the first reference and second reference surfaces is used as the calibrated set of resistors.

In various embodiments, the microprocessor may be configured to choose a first resistor combination for a first light emitter and a second resistor combination for a second light emitter, the first resistor combination providing a different resistance than the second resistor combination.

Another embodiment includes a system that has a microcontroller having an input port and a plurality of switchable ports including a first port, a second port, a third port, and a fourth port, a light source having a first light emitter connected to the first port and a second light emitter connected to the second port, a plurality of resistors including a first resistor connected to the third port and a second resistor connected to the fourth port, the first and second resistors being connected in parallel to the photo transistor, each resistor having a different resistance. In some embodiments, the microcontroller is configured to select a calibration by cycling through resistance combinations of the plurality of resistors, and to identify a combination of the plurality of resistors which produces a first voltage at the input port that best approximates a first predefined voltage target when the selected surface is a first reference surface and produces a second voltage at the input port that approximates a second predefined voltage target when the selected surface is a second reference surface.

In various embodiments, the system includes an input port that is connected in parallel to the phototransistor with the plurality of resistors. In this embodiment, the first reference surface is colored black and the second reference surface is colored white. In this embodiment, the microcontroller chooses a first resistor combination for the first light emitter and a second resistor combination for the second light emitter, the first resistor combination providing a different resistance than the second resistor combination. In various embodiments, the microcontroller is configured to store the first resistor combination for future use with the first light emitter, and the second resistor combination for future use with the second light emitter. In various embodiments the system is included in a playset, the playset including an environment for a plurality of toys, each toy having a colored surface identifiable by the system, the system having a speaker configured to communicate a predetermined message to a user upon identification of the colored surface of one of the toys of the plurality of toys. In various embodiments, the phototransistor is configured to sense light reflected off of a surface from the light source, the first and second light emitters being connected in parallel to the phototransistor.

A method of calibrating a colorimeter, the method providing a plurality of resistors comprising first, second, third, and fourth resistors between a microcontroller and a sensor head, the first, second, third, and fourth resistors being connected to respective first, second, third, and fourth switchable output ports of the microcontroller. The method includes activating a first light source to reflect light from a first reference surface to the sensor head, cycling through a plurality of resistance combinations of the plurality of resistors by switching one or more of the output ports, and recording a low voltage from the sensor head for each resistance combination corresponding to reflected light from the first reference surface from the first light source. The method may further include activating the first light source to reflect light from a second reference surface to the sensor head, cycling through the plurality of resistance combinations of the plurality of resistors by switching one or more of the output ports, and recording a high voltage from the sensor head for each resistance combination corresponding to reflected light from the white surface from the first light source and selecting a calibration for the sensor head for use with the first light source based on a first resistance combination that produces the first predefined voltage that best approximates a low predefined voltage target from the sensor head for reflection from the black surface by the light source and produces the high voltage that best approximates a second predefined voltage target from the sensor head for reflection from the white surface by the first light source.

In various embodiments, the method may further include shining a second light source to reflect light from the first reference surface to the sensor head and cycling through the plurality of resistance combinations of the plurality of resistors by switching one or more of the output ports, and recording a low voltage from the sensor head for each resistance combination corresponding to reflected light from the first reference surface from the second light source. In various embodiments, the method may include activating the second light source to reflect light from the white surface to the sensor head, and cycling through the plurality of resistance combinations of the plurality of resistors by switching one or more of the output ports, and recording a high voltage from the sensor head for each resistance combination corresponding to reflected light from the white surface from the second light source. The method may include selecting a calibration for the sensor head for use with the second light source based on a second resistance combination that produces the low voltage that approximates the low predefined voltage target from the sensor head for reflection from the first reference surface by the second light source and produces the high voltage that approximates the high predefined voltage target from the sensor head for reflection from the second reference surface by the second light source and providing the first light source that emits a light with a first wavelength and providing the second light source that emits a second light with a second wavelength.

In various embodiments, the method includes selecting a resistance combination responsive to determining the resistance combinations that generates the largest difference between a reflectance value from a reflection from the first reference surface and a reflectance value from a reflection from the second reference surface. In various embodiments, the first reference surface is colored black and the second reference surface is colored white. In some embodiments, the method includes the first light source configured to emit a red light and the second light source emitting green light, and each time the first light source is activated the first resistance combination is used and each time the second light source is activated the second resistance combination is used. In some embodiments, the first and second resistance combinations provide a different amount of resistance.

Advantages of the present disclosure will be more readily understood after considering the Drawings and the Detailed Description.

BRIEF DESCRIPTION OF THE DRAWINGS

FIG. 3 is an image of the color reader from FIGS. 1-2c showing a color recognition device.

DETAILED DESCRIPTION

Figure 1:
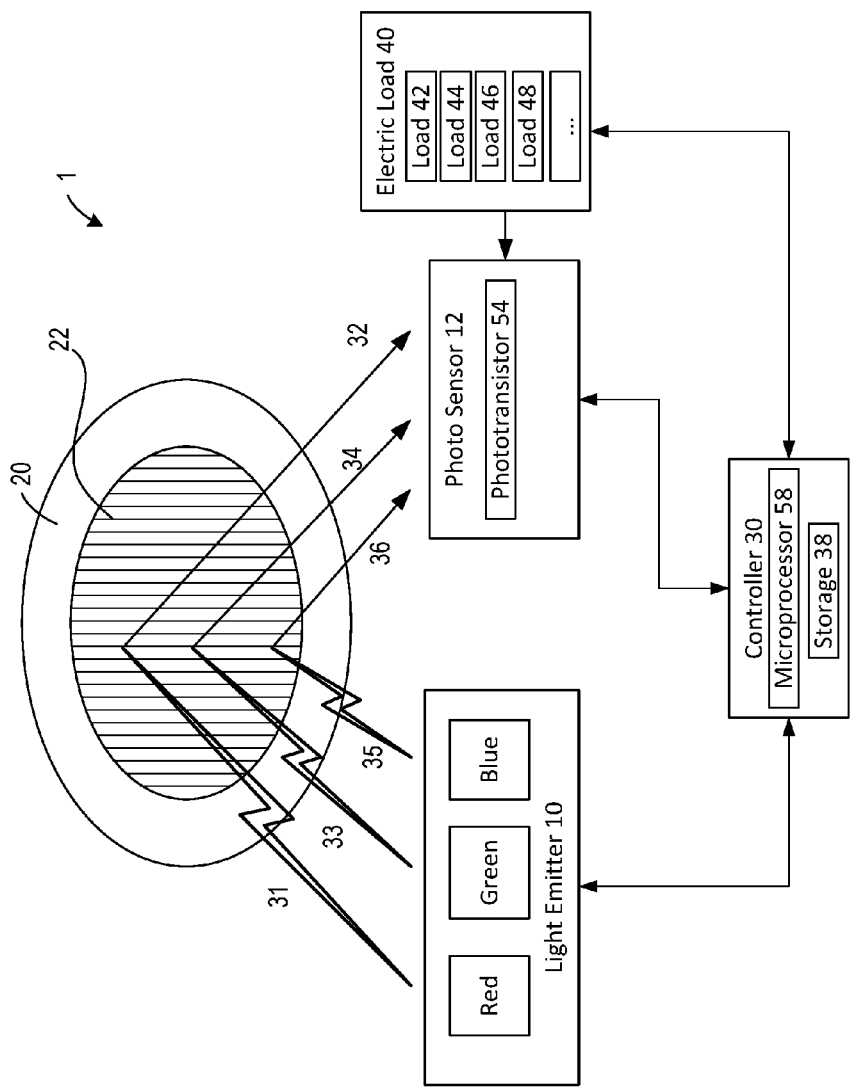
FIG. 1 is a schematic diagram of a colorimeter according to an example embodiment.

Examples of a colorimeter toy and method of use are shown in FIGS. 1-8. Unless otherwise specified, a colorimeter may, but is not required to contain at least one of the structure, components, functionality, and/or variations described, illustrated, and/or incorporated herein.

Embodiments include a resistor combination color LED calibration method that may be applied to a toy play set that has a system with a color reader (e.g., a tri-color (RGB) LED with a single photo receiver or sensor). The calibration process may include identifying a resistor combination for use with the photo receiver that provides the system with the best sensitivity for each of the LED colors. The best sensitivity for each colored LED may be attributed to the combination that produces the maximum difference of voltage (or reflectance value) in the Analog to Digital Converter (ADC) value for a reference white sheet to the ADC value from a reference black sheet. In other embodiments, the selected resistor may be a resistor combination that creates the maximum gradient in the generated reflectance values from a white surface and a black surface. The calibration method may include placing an object that is known to be white over the color reader. In some embodiments, a sheet of white paper may be placed over the color reader. The LED may be activated and the light from the LED may be reflected off of the object (e.g. white object or sheet of paper) and the photo receiver may receive the reflected light. The photo receiver may be configured to register a corresponding reflectance value. In various embodiments, each color of the LED is tested independently from the other colors. In other embodiments, LEDs may be tested or calibrated serially or in parallel.

In an example embodiment the red LED may be tested first, then the green LED, and lastly followed by the blue LED. The order of the testing of the LEDs may be changed in various embodiments. For each color tested, each of the resistor combinations is tested and a reflectance value and/or a voltage output from the phototransistor may be measured. For example, the resistor combination associated with a first resistor (e.g., 70 at 13 KOhms) may be tested first, then the resistor combination associated with the first resistor and a second resistor (e.g. ports 70 and 74 at 7172 ohms), and then the resistor combination associated with the first, second and a third resistor (e.g. ports 70, 74 and 73 at 5129 ohms), etc. In this example embodiment, a sheet of black paper may also be used for each of the resistor combinations to perform the testing.

For each color, the calibration system may identify and store the resistor combination that provides the best sensitivity for a particular color. The best sensitivity for each color may be attributed to the combination that produces the maximum difference of the Analog to Digital Converter (ADC) value or voltage for a reference white sheet compared to the ADC value from a reference black sheet.

Thus, the calibration system identifies a desired resistor combination for each color, and those desired resistor combinations are stored and used by a microcontroller during real-time operations. For example, after the calibration process, the system may identify ports 70 and 74 as the desired resistor combination for the red LED, ports 73 and 74 as the desired resistor combination for the green LED, and ports 70, 73, and 74 and C3 as the desired resistor combination for the blue LED. During real-time operation, when the red LED is used, the ports 70 and 74 combination is also activated. Similarly, when the green LED is used, the ports 73 and 74 combination is activated.

Disclosed herein is a colorimeter, method of use, and method of calibration thereof, which may be applied to a toy playset that includes a system with a color reader. The color reader may include a tri-color (RGB) LED and a photo receiver (e.g., a photo transistor). However, the color reader may include any suitable mechanism or apparatus configured to read a color. The calibration process may identify a resistor combination for use with the photo receiver that provides the system with the best sensitivity for each of the LED colors to produce a calibrated result with low cost components (e.g., imprecise resistors, LEDs, or phototransistor).

Referring to FIG. 1, FIG. 1 is a schematic diagram of a system 1 according to an example embodiment. System 1 includes a light emitter 10, an object 20, a photo sensor 12, electric load 40 and controller 30. In some embodiments, the object 20 in system 1 may be provided by an entity that provided the other parts of system 1. In other embodiments, the object 20 in system 1 may be provided by a different entity than the entity that provided the other parts of system 1.

Light emitter 10 is configured to include one or more light emitters. In an example embodiment, the light emitter may have a single light emitting element that is configured to emit red, green and blue light based on the input received from the controller 30. In other embodiments, the light emitter 10 may include a first, second and third light emitters. As shown in FIG. 1, the light emitter 10 is configured to generate a red light beam 31, a green light beam 33 and a blue light beam 35. In other embodiments, the light emitter 10 may generate other light beams based on the signal received from the controller 30. In various embodiments, the light emitter 10 may be configured to sequentially generate red, green and blue light beams. In various embodiments, the light beams generated by light emitter 10 may pass through one more filters prior to being reflected from or the colored surface 22. In some embodiments, the filter may a polarizing filter. As discussed in greater detail below, light emitter 10 may include a first light emitter 202, a second light emitter 204 and a third light emitter 206. The first light emitter 202 may be configured to generate a red light. The second light emitter 204 may be configured to generate a green light. The third light emitter 206 may be configured to generate a blue light.

The object 20 may be any object with a colored surface 22. In some embodiments, the object 20 may be a figurine, doll, or plastic object in the shape of a real world object, play thing, or action figure. Attached to any portion of the object 20 may be a colored surface 22 that has a color and at least the colored surface 22 having a reflective surface to reflect the light received from the light emitter 10 to the photo sensor 12. Examples of the object 20 are shown in the figures below.

The photo sensor 12 may be configured to receive light that is reflected from the colored surface 22. In some embodiments, the photo sensor 12 may be a phototransistor or other photosensitive circuit that generates a different electrical voltage and/or current based on the wavelength or intensity of the received light. As shown in FIG. 1, a portion of light beam 31 (e.g., red) reflects off of the colored surface 22 of the object 20 to create reflected light beam 32. The photo sensor 12 may receive the reflected light beam 32 and in response to receiving the reflected light beam the photo sensor 12 may generate an electrical signal based on the resistance of electric load 40. In various embodiments, the intensity and output from the photo sensor 12 may be changed depending of the value of the electric load 40. The above allows the system 1 to be calibrated based on changing the loads that are placed on the photo sensor 12. Calibration allows the system 1 to perform optimally when being used after the calibration. Calibration of system 1 identifies the electrical load (e.g., resistance) that may be applied to the photo sensor 12 to yield an optimal result for one or more light beams 31, 33 or 35. After the calibration of the system 1, the controller 30 may store the load configuration for each light bandwidth generated by the light emitter 10. Accordingly, the photo sensor 12 may receive any one or more of the electrical load identifier from electric load 40 based on the input received from controller 30.

Electric load 40 may include a plurality of loads that may be applied individually or in a combined manner based on the input received from controller 30. Electric load 40 may include a plurality of electric loads such as but not limited to load 42, load 44, load 46, and load 48. In various embodiments, the circuits inside electric load 40 may have various resistors connectable to operate in parallel or series. In some embodiments, load 42 may have at least one resistor connected on one end to ground and the other end indirectly connectable to the photo sensor 12. Load 42 may also include an input or output that is sent to the controller 30. Similarly, loads 44, 46 and 48 may be connected in a similar manner as described above with respect to load 42. In various embodiments, load 42 and 44 may operate as a single load, loads 42, 44 and 46 may operate as a single load, or loads 42, 44, 46 and 48 may operate as a single load. Other combinations and permutations of the loads 42, 44, 46 and 48 are also possible. Each new permutation of load combination may generate different resistance for the photo sensor 12 outputs. Varying the resistance or loads on the photo sensor changes the output generated by the photo sensor for each LED and allows the controller 30 to determine which load or load combinations generates the best approximate output from the photo sensor 12. In some embodiments, the loads within electric load 40 may be capacitance based or other electric based loads.

In various embodiments, controller 30 may be a microprocessor or a state machine that includes a microprocessor 58 and storage 38. The controller 30 may also have control lines that are connected to the light emitter 10, photo sensor 12 and electric load 40. The controller 30 may also include individual control and/or output wires that are connected to individual components with the light emitter 10, photo sensor 12 or electric load 40. For example, the controller 30 may be configured to activate each one of the loads 42, 44, 46 and 48 individually or various combinations thereof.

Storage 38 may be a memory circuit that is configured to store various data, including but not limited the results of the calibration. The results of the calibration may include storing which of the load components generate the best sensitivity for each light wavelength (red, green, blue, etc.) After storing the load components that generate the best sensitivity for red, green and blue lights, the controller 30 may configured to activate the load components from electric load 40 based on the calibration data stored in the storage 38 for the LED or color that is being generated.

The system 1 is configured to calibrate the photo sensor 12 using various electric loads within electric load 40. The controller 30 may send control signals and receive resultant signals to and from the light emitter 10, photo sensor 12 and electric load 40 to initially calibrate the system 1. Calibration of system 1 may be configured to determine which one or more loads (e.g., resistors or combination of resistor, etc.) generates signals with the largest difference between the voltage (or reflectance value) generated by a white object and the voltage (or reflectance value) generated by a black object. In various embodiments, loads or combination of load may be determined for each light wavelength. For example, the system may be configured to use different loads for each light wavelength, red light 31, green light 33, and blue light 35. Accordingly, in some embodiments, the controller 30 may calculate the loads for each light wavelength sequentially during the calibration procedure. After the initial calibration the system 1 may be configured to use the determined loads for each light emitted by the light emitter 10.

Each threshold ADC level may be scanned once with color white and black. The nearest RGB ADC readings to white (255, 255, 255) and black (0, 0, 0) by each threshold level may be chosen as the default ADC setting for each photo sensor 10.

Calibration results corresponding to the tested photo sensor 10 may be stored on an EEPROM (electrically erasable programmable read-only memory) for mass production. During calibration, red, green, and blue LED reflectance values are generated based on a reference white object and reference black object (or vice versa). In some embodiments, the reference objects include a grey object from which additional red, green, and blue LED reflectance values are generated. For each color, e.g. black or white or grey, the controller 30 may turn on each color, red, green and blue, of the RGB LED one by one and read the corresponding phototransistor or photo sensor 12 output through the ADC (analog to digital converter) circuit. All resistors or load combinations may be tested during calibration. The ADC value for the phototransistor outputs of different resistor combinations of the red, green, and blue LEDs for the black and white testing papers may be stored in system memory (storage 38), which may be in the MCU (microcontroller) or EEPROM, for later use by the color reader.

Figure 2A:
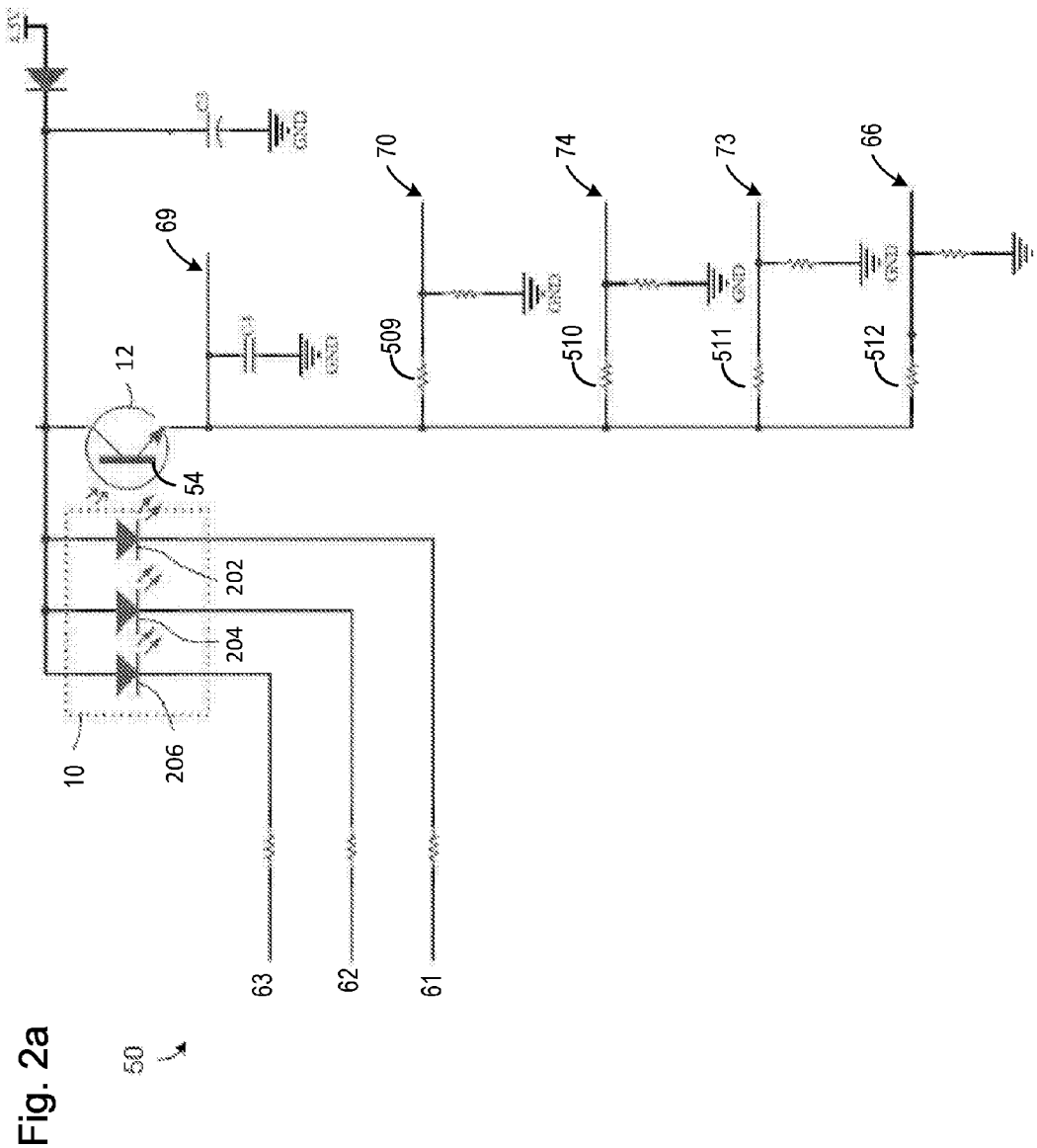
FIGS. 2a-2c show portions of a circuit diagram of a colorimeter from FIG. 1, according to the present disclosure.
Figure 2B:
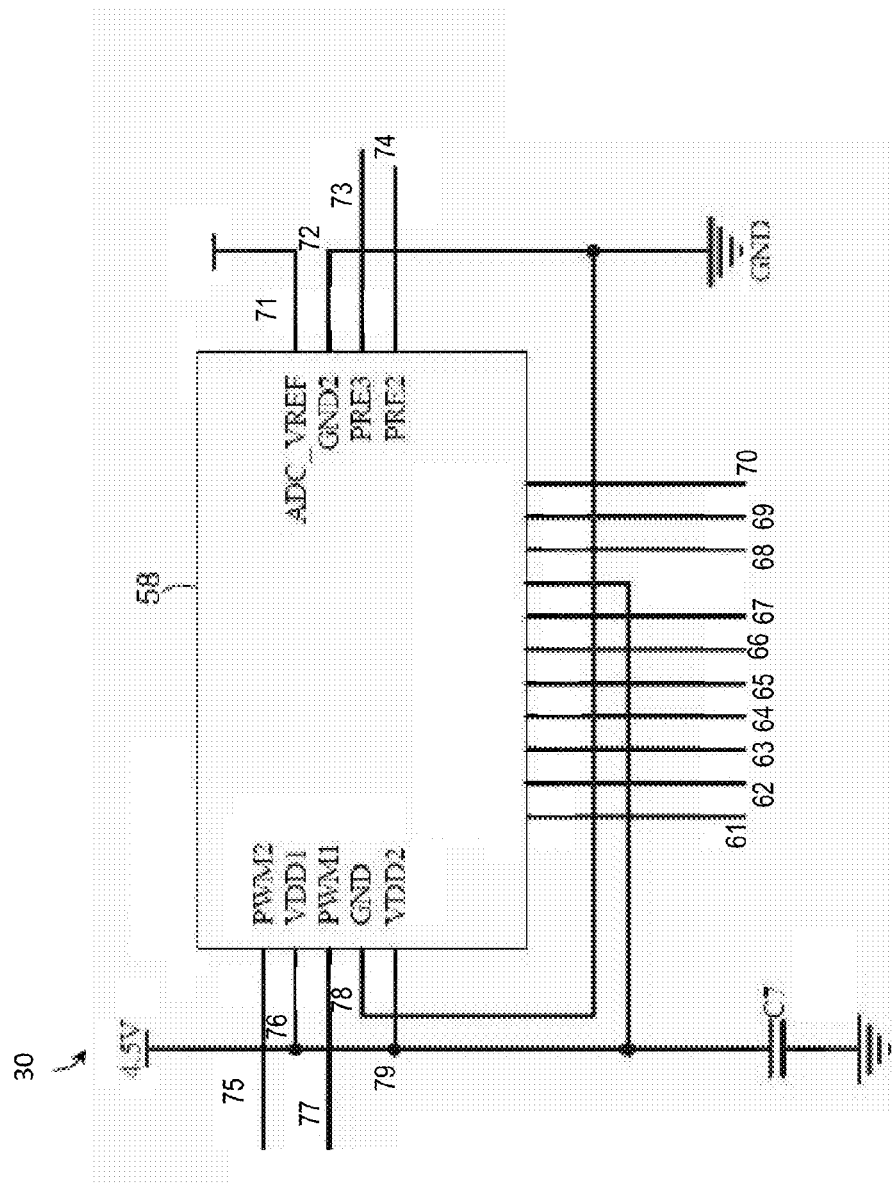

FIG. 2a illustrates an example circuit diagram of portions of system 1 shown in FIG. 1. FIG. 2a includes a light emitter 10, a phototransistor 12 and other photo sensor 12 components, loads 42, 44, 46 and 48. FIG. 2a is a circuit diagram of a colorimeter 50, according to an example embodiment. Colorimeter 50 may include a light emitter 10 (See FIG. 1), a photo transistor 54, a power supply 56 (e.g., a plurality of batteries), a plurality of resistors as loads 42, 44, 46 and 48 (See FIG. 1), and a microcontroller or microprocessor 58 having a plurality of switchable output ports or controlling pins, such as output ports 61, 62, 63, 64, 65, 66, 67, 68, 69, 70, 71, 72, 73, 75, 76, 77, 78, and 79. (See FIG. 2b).

Light emitter 10 may include a first light emitter 202 connected to output port 61, a second light emitter 204 connected to output port 62, and a third light emitter 206 connected to output port 63. Light emitter 10 is shown to be a RGB LED with first, second, and third light emitters 202, 204 and 206 respectively corresponding to the red, green, and blue components of the RGB LED. In some embodiments, light emitter 10 may include other light emitters that may or may not include an LED and/or have red, green and blue components.

As shown in FIG. 2a, the plurality of resistors may include a first resistor 509 connected to output port 70, a second resistor 510 connected to output port 74, a third resistor 511 connected to output port 73, and a fourth resistor 512 connected to output port 66. As shown, resistors 509, 510, 511, and 512 are configured to connect in parallel to phototransistor 54.

Phototransistor 54 may be configured to receive and/or sense reflected light from light emitter 10. For example, light emitted from light emitter 10 may reflect off a selected surface and be directed towards phototransistor 54. Phototransistor 54 is a light-sensitive transistor that generates an electrical signal (e.g., current or change in voltage) when it is exposed to light.

Microcontroller 58 may be configured to identify a combination of the plurality of resistors to be with phototransistor 54 to improve the sensitivity of colorimeter 50 for each of the colors of light emitter 10. For example, microcontroller 58 may be programmed to cycle through the electric load circuits or the resistors and select a calibration based on a low predefined voltage target for reflection from a first selected surface and a higher predefined voltage target for reflection from a second selected surface. The voltage targets may be read at an input port 69 of microcontroller 58.

In one example embodiment, the first selected surface is a black surface, and the second selected surface is a white surface. In some embodiments, the first or the second selected surface may be of another known color, such as but not limited to grey. In other embodiments, calibration of colorimeter 50 may be based on a median predefined voltage target for reflection from a third selected surface, such as but not limited to a grey surface.

To calibrate the colorimeter 50, a sheet of white paper or object may be placed over colorimeter 50. Light from light emitter 10 may be reflected off of the white paper. The reflected light may then be received by phototransistor 54, which registers a corresponding reflectance value. Each color of light emitted by light emitter 10 may be tested independently from the other colors. For example, red may be tested first, then green, and then blue. In other embodiments, the order to the colors that are tested may be changed.

For each color tested, each of the resistor combinations may be tested. For example, the resistor combination associated with output ports 70, 74, 73, and 66 (e.g., 4473 Ohms) may be combined and tested first, then the resistor combination associated with output ports 70, 74, and 73 may be combined (e.g., 5129 Ohms), then output ports 70, 73, and 66 may be combined (e.g., 6209 Ohms), then output ports 74, 73, and 66 may be combined (e.g., 6820 Ohms), then output ports 70 and 74 may be aggregated (e.g., 7172 Ohms), then output from ports 70 and 73 may be aggregated (e.g., 7548 Ohms), then outputs from ports 74 and 73 may be aggregated (e.g., 8471 Ohms), then outputs from ports 70 and 66 may be aggregated (e.g., 9479 Ohms), then outputs from ports 74 and 66 may be aggregated (e.g., 10980 Ohms), then outputs from ports 73 and 66 may be aggregated (e.g., 11887 Ohms), then output from port 70 (e.g., 13000 Ohms), then output from port 74 (e.g., 16000 Ohms), then output from port 73 (e.g., 18000 Ohms), then output from port 66 (e.g., 35000 Ohms), and/or any other suitable resistor combination of the plurality of resistors. Each of the above mentioned electric load values may be tested using a sheet of black or white objects to determine the best sensitivity for each colored LED. The calibration processes described herein may use various resistors and resistor values as shown in Table 1 below.

TABLE 1

| Ports | Ohms | Resistance Combination | Port combinations |
|---|---|---|---|
| 70 | 13000 | 4473 | 70 \|\| 74 \|\| 73 \|\| 66 |
| 74 | 16000 | 5129 | 70 \|\| 74 \|\| 73 |
| 73 | 18000 | 6209 | 70 \|\| 73 \|\| 66 |
| 66 | 35000 | 6820 | 74 \|\| 73 \|\| 66 |
|  |  | 7172 | 70 \|\| 73 |
|  |  | 8471 | 74 \|\| 73 |
|  |  | 9479 | 70 \|\| 66 |
|  |  | 10980 | 74 \|\| 66 |
|  |  | 11887 | 73 \|\| 66 |
|  |  | 13000 | 70 |
|  |  | 16000 | 74 |
|  |  | 18000 | 73 |
|  |  | 35000 | 66 |

For each color, colorimeter 50 may identify and store the resistor combination that provides the best sensitivity for that color. The best sensitivity for each color may be attributed to the combination that produces the maximum difference of an Analog to Digital Converter (ADC) value for the white sheet from an ADC value for the black sheet. The ADC value for the white sheet may correspond to the reflectance value for the white sheet, and the ADC value for the black sheet may correspond to the reflectance value for the black sheet. The ADC value may correspond to the voltage read at input port 69. As shown in FIG. 2a, input port 69 is connected in parallel with output ports 70, 74, 73, and 66 to phototransistor 54.

Figure 2C:
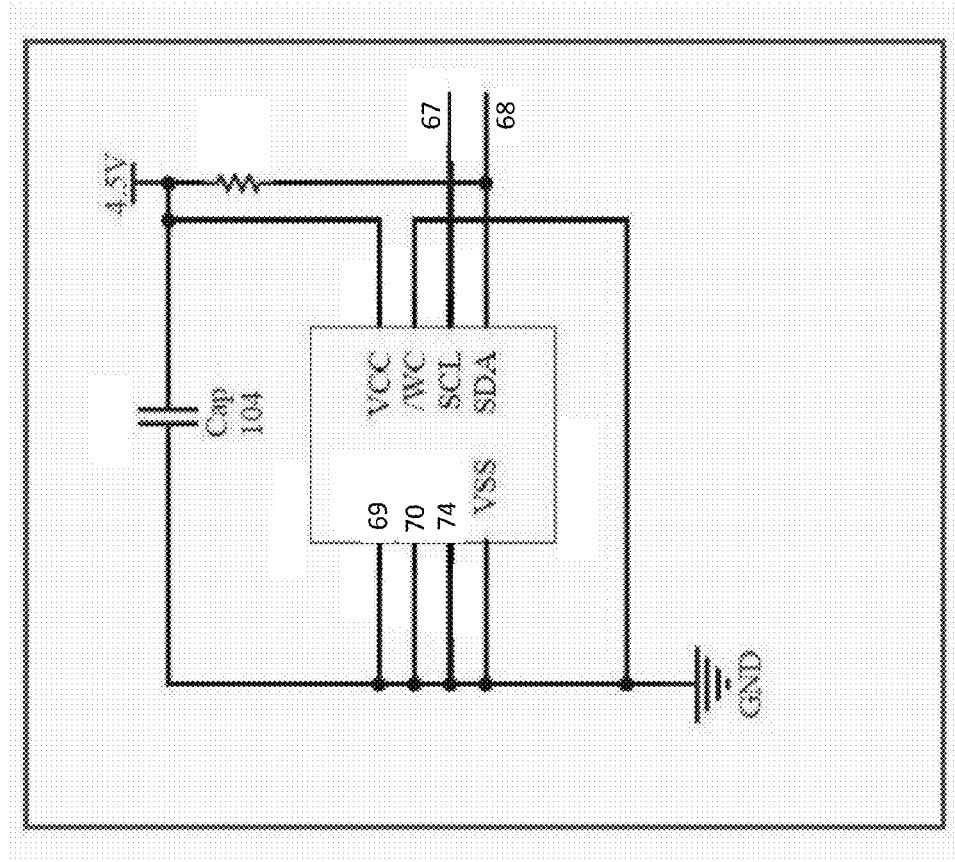

Thus, colorimeter 50 may identify a desired resistor combination for each color, and those desired resistor combinations are stored and used during real-time operations with a plurality of colored surfaces. In some embodiments, colorimeter 50 may include an electrically erasable programmable read-only memory (EEPROM) (storage 38 see FIG. 1 and FIG. 2c) to store the resistor combinations and/or other suitable data. FIG. 2c shows a portion of colorimeter 50 that may store (or be used to store) calibration data in a mass production environment.

In an example embodiment, after calibration, the colorimeter 50 may identify output from ports 70 and 74 as the desired resistor combination for red light, output from ports 74 and 66 as the desired resistor combination for green light, and outputs from ports 70, 74, 73, and 66 as the desired resistor combination for blue. During real-time operation or game play, when the red LED is used, the output of ports 70 and 74 in combination may be used. When the green LED is used, the output from ports 74 and 66 combination may be used. When the blue LED is used, the output from ports 70, 74, 73, and 66 combination may be used for the phototransistor and photo sensor.

In various embodiments, a power supply may supply colorimeter 50 with a stable voltage (e.g., 4.5V). The resistor combination for each RGB LED may be calibrated so that the reflected light intensity from each LED approximates the low predetermined voltage target for the black sheet and the high predetermined voltage target for the white sheet.

The low predetermined voltage target may correspond to a voltage of less than or equal to 1.8V, and the high predetermined voltage target may correspond to a voltage of greater than or equal to 3.3V. In various embodiments, microcontroller 58 may identify the resistor combination for each LED which best approximates the low predetermined voltage corresponding to light reflected off of the first surface at input 69 and also best approximates the high predetermined voltage corresponding to light reflected off of the second surface at input 69. As described herein, microcontroller 58 or an external calibration controller may control the calibration process.

The calibration procedure for a photo sensor 30 for different phototransistors may include setting up a black surface ADC threshold level (e.g., a reflectance value of 0) and a white surface ADC threshold level (e.g., a reflectance value of 255). For example, a voltage equal to the low predetermined voltage target at input port 69 may correspond to the black surface ADC threshold level, and a voltage reading equal to the high predetermined voltage target at input port 69 may correspond to the white surface ADC threshold level.

Each resistor combination may be tested for each LED and microcontroller 58 may identify and store the resistor combination for each LED that produces reflectance values closest to the ADC threshold levels and/or produces a maximum difference between the black surface reflectance value and the white surface reflectance value. For example, when testing the red LED, a first resistor combination may produce a black surface reflectance value of 100 and a white surface reflectance value of 220. A second resistor combination may produce a black surface reflectance value of 95 and a white surface reflectance value of 245. In this case, microcontroller 58 may identify the second resistor combination as a better resistor combination for the red LED than the first resistor combination. If microcontroller 58 identifies the second resistor combination as the best resistor combination out of all other combinations tested for the red LED, then microcontroller 58 may store the second resistor combination as the calibrated resistor combination to be used in conjunction with the red LED for future color recognition.

Resistor combinations for the other LEDs may be tested, identified, and stored in a similar manner. For example, microcontroller 58 may store a third resistor combination for the green LED, which may produce a black surface reflectance value of 92 and a white surface reflectance value of 240. The microcontroller 58 may store a fourth resistor combination for the Blue LED, which may produce a black surface reflectance value of 80 and a white surface reflectance value of 243. In this example embodiment, colorimeter 50 may be calibrated with white surface red, green, and blue reflectance values of 245, 240, 243 and black surface red, green, blue reflectance values of 95, 92, 80 corresponding respectively to the second resistor combination for red, and the third resistor combination for green, and the fourth resistor combination for blue. The calibration results corresponding to each of the LEDs may be stored into the EEPROM and/or memory 38 in microcontroller 58 (or controller 30), and may be used for subsequent mass production.

Colorimeter 50 and the process of calibration, described herein, allows for inexpensive imprecise components (e.g., imprecise resistors or phototransistors) to be used to produce a calibrated result. In normal operation of the toy play set, the specific resistor combination for each LED, which was determined during calibration, may be used. This combination may be stored in the system memory 38, either in on-chip memory included in microcontroller 58, in EEPROM, or in any other suitable medium.

FIG. 3 is a photograph showing a top view of color reader 104. As shown, color reader 104 may include a housing or platform 138, a color recognition device 140 for identifying the colored surfaces of the toy figures, a window 142, a button 144 to activate color reader 104. The color reader may include an indication device such as an LED 146 to indicate the activity of color reader 104 and a speaker 148 configured to communicate a predetermined message or signal to a user upon identification of the colored surface of one of the toy figures.

Figure 4:
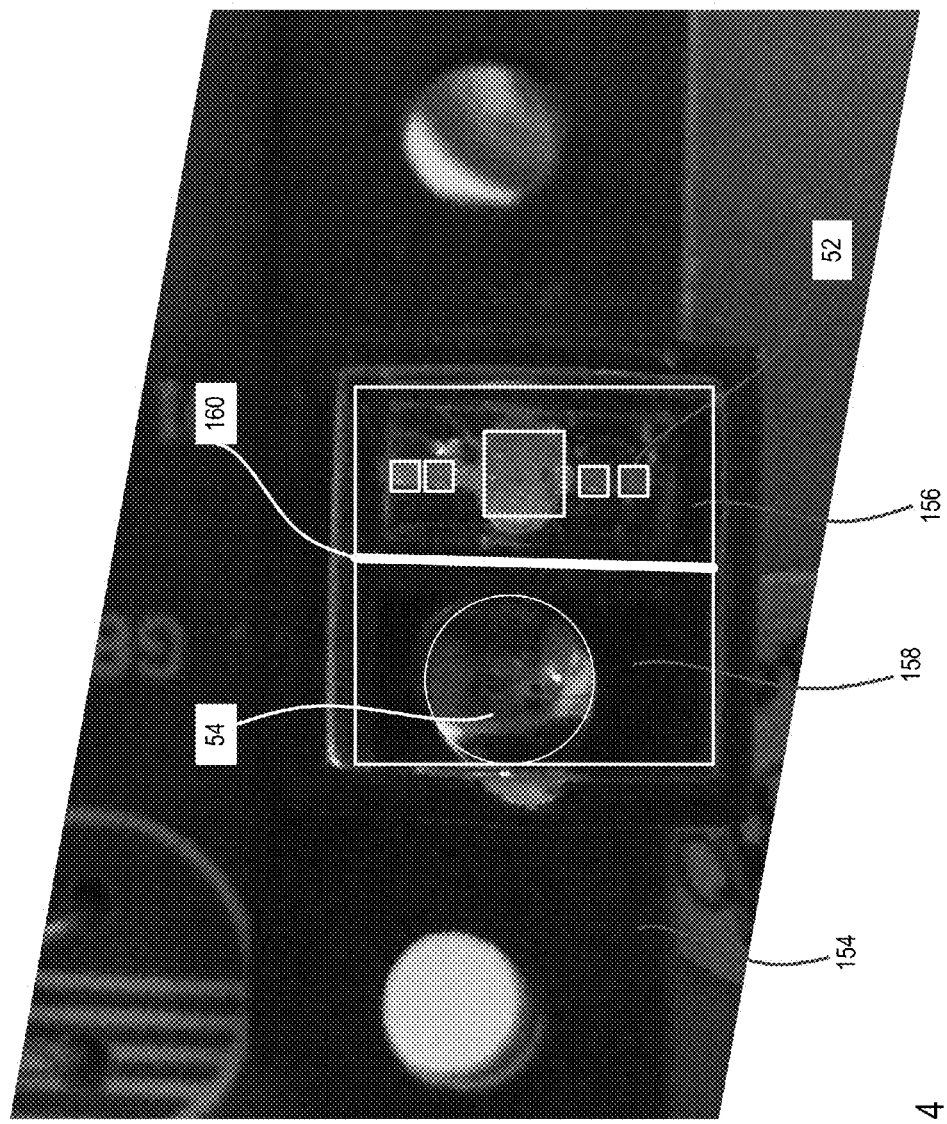
FIG. 4 is an image of the light emitter and photo sensor of the colorimeter of FIG. 3 with an outer housing of the color recognition device being removed.

FIG. 4 is a drawing of color recognition device 140 with an outer housing removed to show light RGB LED 52 and photo transistor 54 disposed within an inner housing 154. As shown, inner-housing 154 includes a first hole 156 in which RGB LED 52 is placed, a second hole 158 in which photo transistor 54 is placed, and a wall 160 separating hole 156 from hole 158. As shown, holes 156 and 158 each have a rectangular shape, which are each approximately 3 mm by 5 mm; and wall 160 is approximately 1 mm thick. Window 142 (see FIG. 4) may be placed 5 mm above RGB LED 52 and phototransistor 54. A top surface of inner housing 154 may be arranged slightly less than 5 mm below window 142. However, in other embodiments these components may have other dimensions or shapes.

Inner-housing 154 may be arranged within an outer housing, and wall 160 may be configured to prevent light emitted from RGB LED 52 to be directly received by phototransistor 54. Inner and outer housings may be configured to direct light emitted from RGB LED 52 inside first hole 156 through window 142, where the light may be reflected off a selected colored surface to produce reflected light. The reflected light may then be directed back through window 142 toward phototransistor 54, disposed inside second hole 154, which may sense the reflected light. Microcontroller 58 may then identify a color of the reflected light to determine a color of the selected colored surface.

Figure 5:
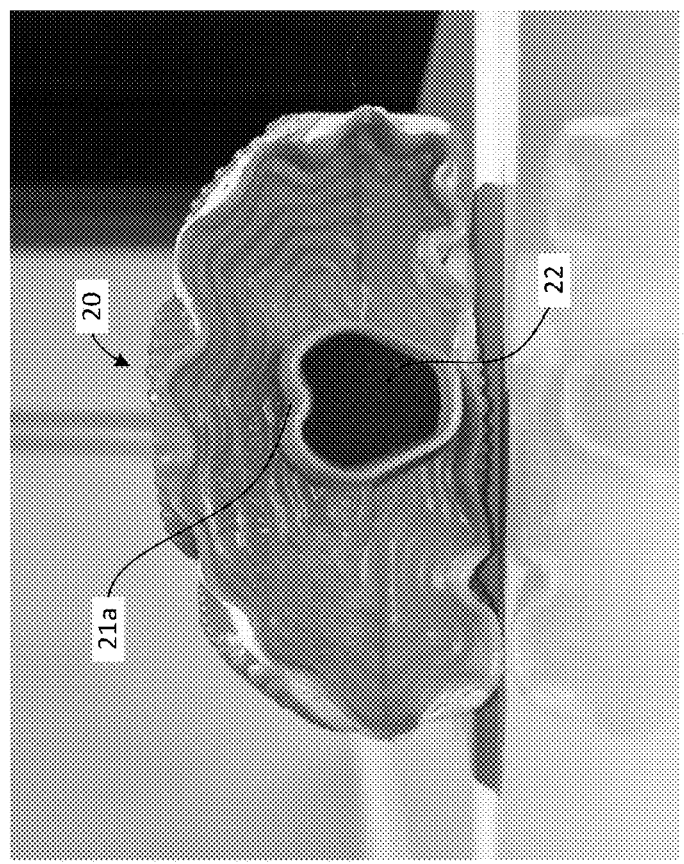
FIG. 5 is an image of an object having a colored surface, according to an exemplary embodiment.

As described, each of the one or more toy figures may have a colored surface. The colored surface of each toy figure may be characterized by a distinct color that is identifiable by color reader 104, in various embodiments. For example, FIG. 5 shows a foot portion of object 20 having a colored surface 22 located within a recess 21a. Although a single object 20 with a single color is shown in FIG. 5, various other objects and various other colors and color combination may be used to activate system 1 or colorimeter 50. Microcontroller 58 (see FIGS. 1 and 2a) of color reader 104 (See FIG. 3) may be programmed to identify the first, second, third, and fourth colors, up to 16 colors and/or distinguish these colors one from another to generate a different response based on the scanned color.

One or more of the recesses of an associated object may be shaped and/or dimensioned to correspond to the shape and/or dimension of color recognition device 140 (see FIG. 3). As shown in FIG. 3, color recognition device 140 is shaped to resemble a pair of feet. As shown in FIG. 5, recess 21a is shaped and/or dimensioned to correspond to the shape and/or dimension of color recognition device 140. These corresponding shapes and/or dimensions may prevent ambient light from entering the color recognition device 140 and/or may encourage the user to place the object (or article) on color recognition device 140. Other objects may have a substantially greater surface area than color recognition device 140 (see FIG. 3), to help the user place the colored surfaces on color recognition device 140.

Figure 6:
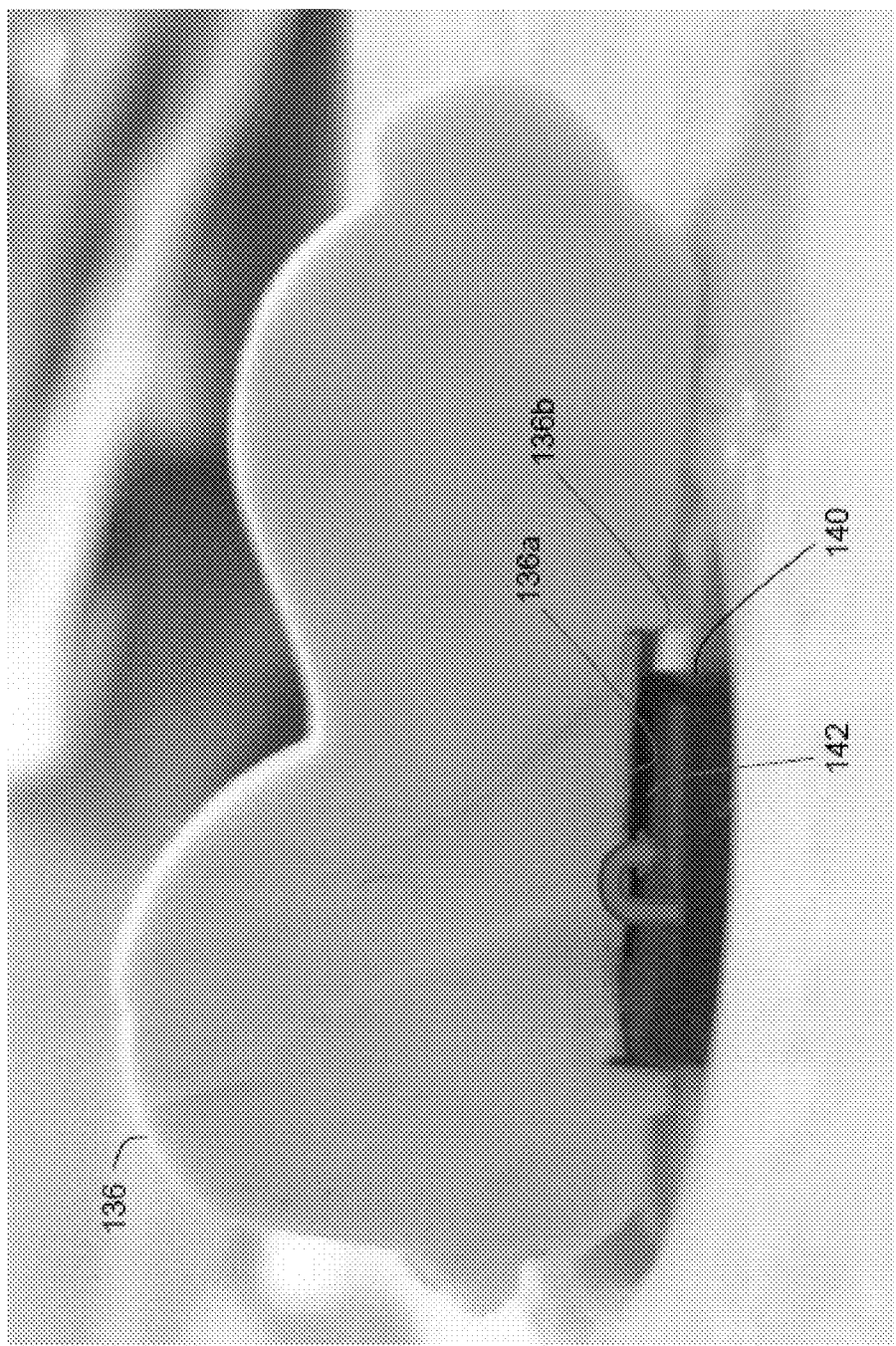
FIG. 6 is an image of an object having a colored surface, according to an exemplary embodiment.

FIG. 6 is a drawing showing a cross-section of recess 136b of object 136 placed over window 142 of color recognition device 140. Colored surface 136a may have a fourth color. As indicated by an annotated arrow, light emitted from light emitter 10 (see FIGS. 1 and 2a-2c) may be directed toward colored surface 136a through window 142. The emitted light may be reflected from of colored surface 136a, and may be directed back through window 142 towards phototransistor 54. The calibrated circuit of FIGS. 1, 2a-2c, for example, may identify colored surface 136a as being a fourth color.

When the color reader 104 identifies the color of the colored surface, the color reader 104 may be programmed to emit a signal corresponding to the identified toy. For example, when color reader 104 identifies the first color, color reader 104 may emit a first signal (e.g., a first predetermined message) corresponding to the first character (e.g., a simulated voice corresponding to the first character). When the color reader 104 identifies the second color, the color reader 104 may emit a second signal (e.g., a second predetermined message) corresponding to the second character or other character (e.g., a simulated voice corresponding to the second character or other characters).

In order for the color reader 104 to recognize the article and emit the corresponding signal (e.g., through speaker 148), the user can activate color reader 104 by pressing button 144 (see FIG. 3). Then, the user may place the colored surface of a first article on window 142 of color recognition device 140. Color reader 104 may identify a characterizing color of the colored surface of the first article and emit the corresponding signal (e.g., an associated predetermined signal). The user may remove the first article from color recognition device 140 to play with the first article as indicated by the emitted signal. For example, the user may place a second article on color recognition device 140.

In some embodiments, color reader 104 may be configured to emit a second associated predetermined signal when the first article, or any other article, is subsequently placed on and recognized by color recognition device 140. The second predetermined signal may correspond to a different location or a different activity to be performed.

Color reader 104 may be calibrated so that a predetermined resistor combination is used for each LED in light emitter 10 to identify the color of the colored surface of the associated object and emit the corresponding signal to the user. As described, color reader 104 may use a different resistor combination for each LED of light emitter 10.

Figure 7:
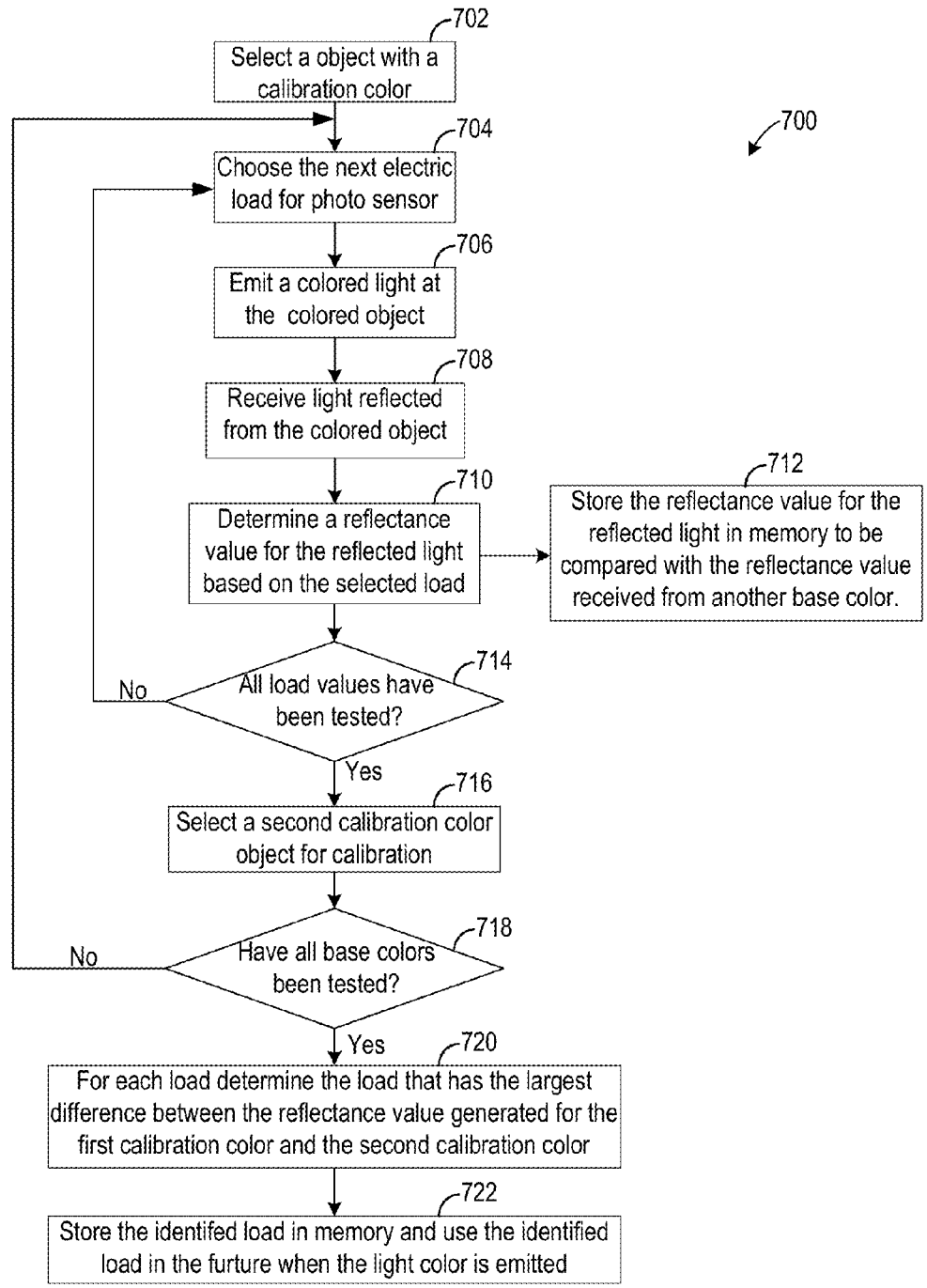
FIG. 7 is a flow chart of a process that may be used to calibrate the colorimeter shown in FIGS. 1-2c, according to an exemplary embodiment.

FIG. 7 is a flow chart of an example calibration process 700 that may be implemented by the system shown in FIGS. 1-2*c*. The process 700 is performed to calibrate the colorimeter 50. Process 700 may be used by the system 1 to calibrate the colorimeter 50. At step 702 a user or calibrator may select a base color object for calibrating the colorimeter. In an example embodiment, the base color object may be colored white or black. Next at step 704, system 1 may choose one or more electric loads 40 to use with the photo sensor 12 to calibrate the photo sensor 12. In the calibration process 700 the system 1 can cycle through the various loads that are available in order to determine the most optimal load to use with the photo sensor 12.

After choosing the calibration color and the resistance or load to apply to the photo sensor, the controller 30 may send a signal to the light emitter 10 to generate a colored light, at step 706. After receiving the signal to generate the colored light, the light emitter 10 may create a light of at least one of red, green or blue light. The calibration process 700 may be conducted separately for each colored light, in various embodiments.

After emitting the light at step 706, the light beam may be reflected by the colored objects to the photo sensor 12. Next at step 708, the photo sensor 12 may receive the light reflected from the colored object. After receiving the reflected light the photo sensor 12 may generate an electrical signal to the controller 30.

Next at step 710, the controller 30 may determine a reflectance value for the reflected light based on the electric load. In various embodiments, after determining the reflectance value the reflectance value may be stored in storage 38 for later comparison. Next at step 714, the system 1 may determine whether all possible or potential electric load values have been tested for the colored light. After determining that all load have not been tested the process 700 may return just prior to step 704. In this embodiment, the next load value may be selected at step 704 and the process 700 may be run iteratively to test each load value. In some embodiments, the system 1 may not cycle through every possible load value but instead may cycle through predetermined electric load values (e.g. Table 1). After determining that all potential load values have been tested, the process 700 may test the next calibration color.

At step 716, the system 1 may select a second calibration color. In some embodiments, the second calibration color may be white or black. In other embodiments, other colors may be used to calibrate the photo sensor 12. Next at step 718, the system 1 determines whether all base colors that were going to be used for calibration have been tested. If some calibration colors have not been tested, then the system 1 begins process 700 with the remaining calibration color or color(s). If all calibration colors have been tested, then the system 1 performs step 720. At step 720, for each load the system 1 determines the load that has the largest difference between the reflectance values generated for the first calibration color and the second calibration color.

Next at step 722, the controller 30 may store the calibration electrical loads in memory and use the calibration electrical loads in the future when the light is emitted from the light emitter 10. In other embodiments, process 700 may be performed a few times for lights with different colors (e.g., RGB emitter).

Figure 8:
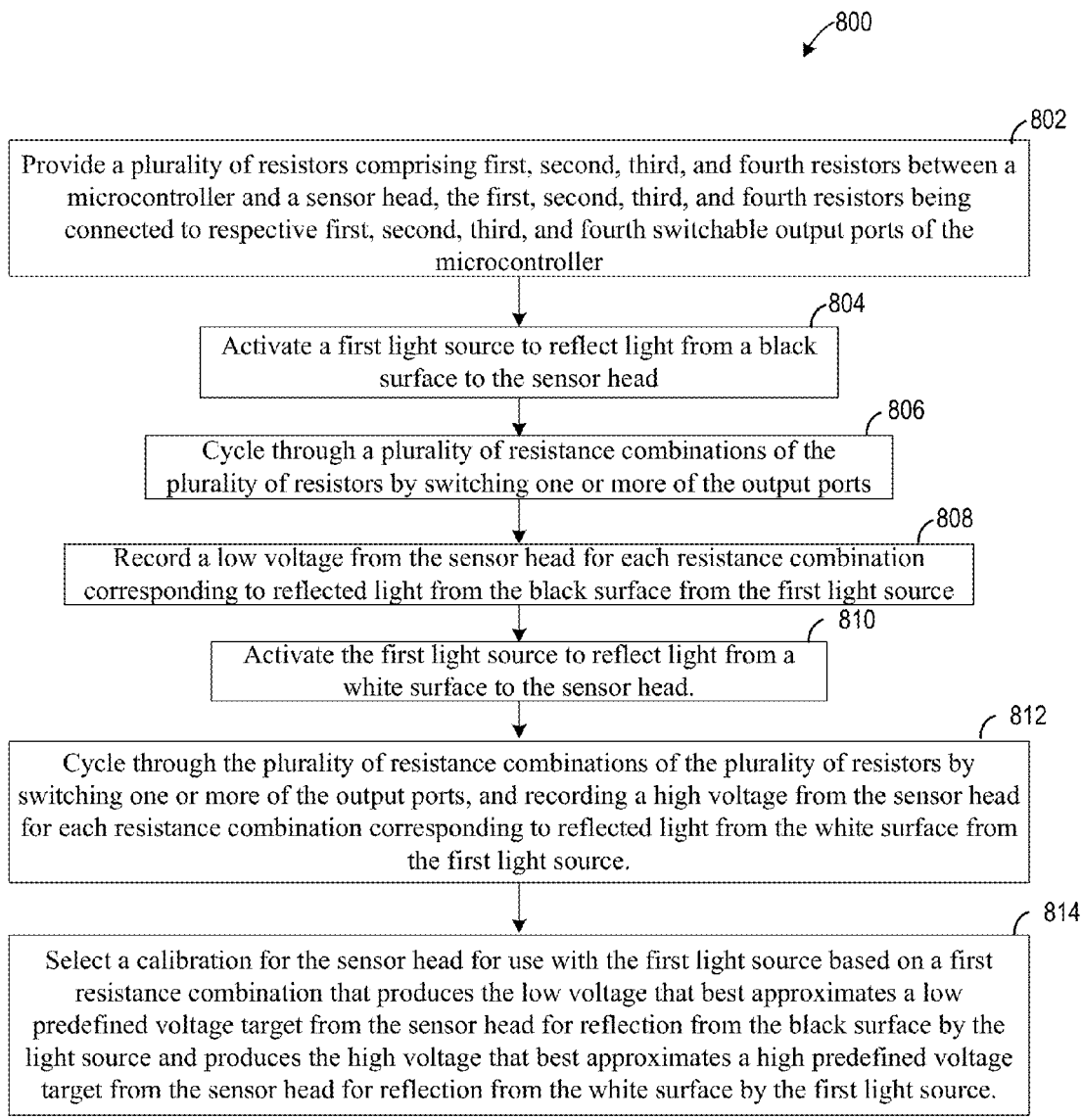
FIG. 8 is a flow chart of a method that may be used to calibrate the colorimeter shown in FIGS. 1-2c, according to an exemplary embodiment.

FIG. 8 illustrates a method 800 of calibrating a colorimeter 50 in the photo sensor 12 (or sensor head), according to aspects of the present disclosure. Method 800 may include a step 302 of providing a plurality of resistors including first, second, third, and fourth resistors connected in parallel or in series between a microcontroller and the sensor head, the first, second, third, and fourth resistors being connected to respective first, second, third, and fourth switchable output ports of the microcontroller.

Method 800 may include a step 804 of activating a red LED to reflect light from a black surface to the sensor head (photo sensor 12). Next at step 806 the system may cycle through a plurality of resistance combinations of the plurality of resistors by switching one or more of the output ports. Next at step 808 the system may record a low voltage from the sensor head for each resistance combination corresponding to reflected light from the black surface from the red LED.

Method 800 may include a step 810 of activating the red LED to reflect light from a white surface to the colorimeter sensor head. At step 312 the method 800 may cycle through the plurality of resistance combinations of the plurality of resistors by switching one or more of the output ports, and recording a high voltage from the sensor head for each resistance combination corresponding to reflected light from the white surface.

Method 800 may include a step 814 of selecting a calibration for the sensor head to be used with the red LED. The calibration is selected based on the resistance combination that produces a low voltage that best approximates a low predefined voltage target from the sensor head of a reflection from the black surface. The calibration is selected based on the resistance combination that produces a high voltage that best approximates a high predefined voltage target from the sensor head of a reflection from the white surface.

In some embodiments of method 800, step 804 corresponding to shining the red LED on the black surface may be carried out prior to or after steps 810 corresponding to shining the red LED on the white surface. This grouping of steps may streamline method 800, resulting in a faster more efficient calibration process.

Although method 800 refers to emitting a red LED, embodiments include emitting a green LED and performing steps 802-814 for a green LED. Similar steps 802-814 may be performed for a blue LED. Accordingly, method 800 may be used to calibrate a RGB LED with multiple colors. With the set-up above, we can fully utilize the voltage range available for each RGB LED while doing color detection (apply on color paper reflection).

This disclosure relates to color recognition threshold selection by multi-output pins that uses low cost, high tolerance components. In some embodiments, the above disclosed components and methods of calibration provide a low-cost colorimeter for a playset. The window region of the colorimeter may be shaped so that a correspondingly shaped base of various toy figures and accessories covers the window region. The calibration method allows the use of low-cost electronic components, such as high-tolerance resistors, and results in accurate identification of up to 15 different color samples in some embodiments. Each such color sample may be associated with a different toy figure or accessory, allowing a magical playing experience for children and adults.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

What is claimed is:

1. A colorimeter comprising:
a microprocessor with multiple switchable output ports;
a light source connected to three of the output ports;
a photo transistor for sensing reflected light;
at least two different resistors, each of the resistors connected to a corresponding additional one of the output ports, the at least two different resistors configured to connect the photo transistor to the microprocessor,
the microprocessor configured to cycle through the at least two resistors and select a calibration based on a first predefined voltage target for reflection from a first reference surface and a second predefined voltage target for reflection from a second reference surface.

2. The colorimeter of claim 1, wherein selecting a calibration further comprises the microprocessor configured to select a resistor or a set of resistors based on the first predefined voltage target for reflection from the first reference surface and the second predefined voltage target for reflection from the second reference surface;
wherein the first predefined voltage target is different than the second predefined voltage target.

3. The colorimeter of claim 2, wherein selecting a calibration comprises the microprocessor configured to store a resistor or resistor combination that allows the photo transistor to generate a lowest voltage for reflection from the first reference surface;
wherein selecting a calibration comprises the microprocessor configured to store a resistor or resistor combination that allows the photo transistor to generate a highest voltage for reflection from the second reference surface;
wherein the first reference surface is colored black and the second reference surface is colored white.

4. The colorimeter of claim 2, further comprises the microprocessor is configured to determine which of the at least two different resistors generate the largest difference between a reflectance value from a reflection of the first reference surface and a reflectance value from a reflection of the second reference surface by cycling through the at least two resistors for the light source; and
wherein the first predefined voltage target is lower than the second predefined voltage target.

5. The colorimeter of claim 1, wherein light source is a tri-band wavelength light source that further comprises one or more lights that are configured to generate colored lights comprising at least one of a red, green or blue light when activated.

6. The colorimeter of claim 5, wherein the microprocessor colorimeter is configured to determine which of the at least two different resistors or a combination of the two resistors generate the difference gradient between a reflectance value from a reflection of the first reference surface and a reflectance value from a reflection of the second reference surface by cycling through the at least two resistors for the red light;
wherein the microprocessor is further configured to determine which of the at least two different resistors or the combination of the two resistors generate the largest difference between a reflectance value from a reflection of the first reference surface and a reflectance value from a reflection of the second reference surface by cycling through the at least two resistors for the green light;
wherein the microprocessor is further configured to determine which of the at least two different resistors or the combination of the two resistors generate the largest difference between a reflectance value from a reflection of the first reference surface and a reflectance value from a reflection of the second reference surface by cycling through the at least two resistors for the blue light.

7. The colorimeter of claim 6, wherein the microcontroller is configured to use the determined resistance load for the red light;
wherein the microcontroller is configured to use the determined resistance load for the green light;
wherein the microcontroller is configured to use the determined resistance load for the blue light;
wherein the resistance load is one resistor or a combination of resistors.

8. The colorimeter of claim 1, wherein the two different resistors are connected in parallel to the photo transistor.

9. The colorimeter of claim 1, wherein the light source comprises a red light source, a green light source and a blue light source that are powered sequentially to generate a light that shines and reflects from the first reference surface or the second reference surface;
wherein the microcontroller is configured to determine whether either of the at least two resistors or the combination of the at least two resistors generates the largest difference between a reflectance value from a reflection of the first reference surface and a reflectance value from a reflection of the second reference surface.

10. The colorimeter of claim 1, wherein the microprocessor is configured to choose a first resistor combination for a first light emitter and a second resistor combination for a second light emitter, the first resistor combination providing a different resistance than the second resistor combination.

11. A system comprising:
a microcontroller having an input port and a plurality of switchable ports including a first port, a second port, a third port, and a fourth port;
a light source having a first light emitter connected to the first port and a second light emitter connected to the second port; and
a plurality of resistors including a first resistor connected to the third port and a second resistor connected to the fourth port, the first and second resistors being connected in parallel to the photo transistor, each resistor having a different resistance;
wherein the microcontroller is configured to select a calibration by cycling through resistance combinations of the plurality of resistors, and to identify a combination of the plurality of resistors which produces a first voltage at the input port that best approximates a first predefined voltage target when the selected surface is a first reference surface and produces a second voltage at the input port that approximates a second predefined voltage target when the selected surface is a second reference surface.

12. The system of claim 11, wherein the input port is connected in parallel to the phototransistor with the plurality of resistors; and
wherein the first reference surface is colored black and the second reference surface is colored white.

13. The system of claim 11, wherein the microcontroller chooses a first resistor combination for the first light emitter and a second resistor combination for the second light emitter, the first resistor combination providing a different resistance than the second resistor combination.

14. The system of claim 11, wherein the microcontroller configured to store the first resistor combination for future use with the first light emitter, and the second resistor combination for future use with the second light emitter.

15. The system of claim 11, wherein the system is included in a playset, the playset including an environment for a plurality of toys, each toy having a colored surface identifiable by the system, the system having a speaker configured to communicate a predetermined message to a user upon identification of the colored surface of one of the toys of the plurality of toys.

16. The system of claim 11, wherein the photo transistor is configured to sense light reflected off of a surface from the light source, the first and second light emitters being connected in parallel to the photo transistor.

17. A method of calibrating a colorimeter, the method comprising:
providing a plurality of resistors comprising first, second, third, and fourth resistors between a microcontroller and a sensor head, the first, second, third, and fourth resistors being connected to respective first, second, third, and fourth switchable output ports of the microcontroller;
activating a first light source to reflect light from a first reference surface to the sensor head;
cycling through a plurality of resistance combinations of the plurality of resistors by switching one or more of the output ports;
recording a first predefined voltage from the sensor head for each resistance combination corresponding to reflected light from the first reference surface from the first light source;
activating the first light source to reflect light from a second reference surface to the sensor head;
cycling through the plurality of resistance combinations of the plurality of resistors by switching one or more of the output ports, and recording a high voltage from the sensor head for each resistance combination corresponding to reflected light from the second reference surface from the first light source; and
selecting a calibration for the sensor head for use with the first light source based on a first resistance combination that produces the first predefined voltage that best approximates a low predefined voltage target from the sensor head for reflection from the first reference surface by the light source and produces a high voltage that best approximates a second predefined voltage target from the sensor head for reflection from the second reference surface by the first light source.

18. The method of claim 17, further comprising shining a second light source to reflect light from the first reference surface to the sensor head;
cycling through the plurality of resistance combinations of the plurality of resistors by switching one or more of the output ports, and recording a low voltage from the sensor head for each resistance combination corresponding to reflected light from the first reference surface from the second light source;
activating the second light source to reflect light from the second reference surface to the sensor head;
cycling through the plurality of resistance combinations of the plurality of resistors by switching one or more of the output ports, and recording a high voltage from the sensor head for each resistance combination corresponding to reflected light from the second reference surface from the second light source; and
selecting a calibration for the sensor head for use with the second light source based on a second resistance combination that produces the low voltage that approximates the low predefined voltage target from the sensor head for reflection from the first reference surface by the second light source and produces the high voltage that approximates the high predefined voltage target from the sensor head for reflection from the second reference surface by the second light source,
wherein the first light source has a first wavelength and the second light source has a second wavelength.

19. The method of claim 18, further comprises selecting a resistance combination responsive to determining which of the resistance combinations generates the largest difference between a reflectance value from a reflection of the first reference surface and a reflectance value from a reflection of the second reference surface;
wherein the first reference surface is colored black and the second reference surface is colored white.

20. The method of claim 18, wherein the first light source emits red light and the second light source emits green light, and each time the first light source is activated the first resistance combination is used and each time the second light source is activated the second resistance combination is used.

* * * * *